(12) United States Patent
Ylämurto et al.

(10) Patent No.: US 6,545,516 B2
(45) Date of Patent: Apr. 8, 2003

(54) FREQUENCY CONVERSION

(75) Inventors: Tommi Ylämurto, Sunnyvale, CA (US); Leonid Bogod, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/964,122

(22) Filed: Sep. 25, 2001

(65) Prior Publication Data

US 2002/0039893 A1 Apr. 4, 2002

(30) Foreign Application Priority Data

Sep. 29, 2000 (FI) .................................................. 002164

(51) Int. Cl.[7] .................................................. H04B 1/16
(52) U.S. Cl. ........................ 327/113; 327/355; 327/357; 455/319; 455/326
(58) Field of Search .................................. 327/105, 113, 327/115, 355, 361, 357; 455/333, 326, 319

(56) References Cited

U.S. PATENT DOCUMENTS

| | | | |
|---|---|---|---|
| 4,320,531 A | 3/1982 | Dimon | 455/203 |
| 5,678,222 A | 10/1997 | Hornak et al. | 455/319 |
| 5,761,615 A * | 6/1998 | Jaffee | 455/314 |
| 6,085,075 A * | 7/2000 | Van Bezooijen | 455/260 |

FOREIGN PATENT DOCUMENTS

WO    WO 99/16179    4/1999

OTHER PUBLICATIONS

Patent Abstracts of Japan document No. 07–321686, (English translation is attached).

* cited by examiner

*Primary Examiner*—Dinh T. Le
(74) *Attorney, Agent, or Firm*—Perman & Green, LLP

(57) ABSTRACT

A method for converting the frequency of an electrical signal, where an input signal is received, a first local signal and a second local signal of a different phase than the first local signal, are generated. A first product signal is obtained by mixing said input signal with the first local signal and a second product signal is obtained by mixing said input signal with the second local signal. The first and second product signals are combined together. The mixing of the input signal with the first local signal and the mixing of the input signal with the second local signal occurs in alternating time periods. The same mixing element is used for processing two or more branches in order to avoid imbalance in the mixed signals due to usage of separate, mismatching, mixing elements. The invention also relates to radio devices implementing the method described above.

17 Claims, 6 Drawing Sheets

FREQUENCY CONVERSION

FIELD OF THE INVENTION

The invention relates to a frequency converter and a method for frequency conversion. It is related particularly, but not exclusively, to wireless mobile stations.

BACKGROUND OF THE INVENTION

The continuous demand for more compact and inexpensive mobile phones has led to the search for alternative radio architectures to replace the traditional superheterodyne architecture. Architectures having direct conversion receivers and low-IF (Intermediate Frequency) receivers have been proposed. Unfortunately, the alternative receiver architectures have drawbacks. Direct conversion receivers are sensitive to DC offset and with low-IF receivers it is difficult to achieve sufficient suppression of image frequencies. Problems also exist with single sideband transmitters. Poor image suppression causes carrier leakage and signal leakage to the image frequencies. In all these cases, insufficient matching between two mixer branches will lessen the performance of a receiver, a transmitter or a mixer.

There are several sources of DC offset in a direct conversion receiver. One harmful DC offset component is proportional to the input power, and will make the resulting DC level change corresponding to changes in the incoming power level. This phenomenon is called AM (Amplitude Modulation) detection. AM detection is harmful in TDMA (Time Division Multiple Access) systems and systems using linear modulation schemes. The reason for this power detection lies in the signal squaring behaviour in certain functional blocks of a receiver. A mixer often presents most problems, because it must be capable of handling all the incoming power although it is DC coupled with the baseband circuit blocks.

The traditional way to avoid AM detection is by the use of balanced frequency converters or mixers. FIG. 1 shows an example of a single balanced frequency converter 10 according to the prior art, in order to illustrate the operating principle of typical single balanced frequency converters. The converter 10 receives an incoming signal, filters out non-desired frequencies to give a desired frequency band, generates two parallel, out-of-phase mixed signals by mixing the desired band with out-of-phase local oscillator (LO) signals, combines both mixed out of phase signals to a single signal and, finally, post-selection filters them.

The converter 10 comprises a pre-selection filter 13 having an input port for receiving an incoming signal x. The pre-selection filter has an output port for providing a filtered incoming signal x' having the desired frequency band. This filtered incoming signal x' is then to be mixed with LO signals of opposite phases by two mixing elements MIX1A and MIX1B. The two mixing elements are located in parallel branches. A first mixing element MIX1A has an input port for the filtered incoming signal x' and another input port for an in-phase LO signal. A second mixing element MIX1B has also an input port for the filtered incoming signal x' and another input port for an anti-phase LO signal.

The in-phase and anti-phase LO signals originate from an LO signal z, which is coupled to an input port of a phase shifter unit 11. The LO signal is of a frequency $f_{LO}$. The phase shifter unit 11 produces an in-phase output 11A and a 180 degrees ($\pi$) phase-shifted anti-phase output 11B from the LO signal z. The in-phase output 11A is coupled to the LO input port of the first mixing element MIX1A to produce a first mixed signal and the anti-phase output 11B is coupled to the LO input port of the second mixing element MIX1B to produce a second mixed signal.

The outputs of the first and second mixing elements MIX1A and MIX1B, which are the first mixed signal and, respectively the second mixed signal, are coupled to first and second input nodes 12A and 12B of a combiner 12. The first mixed signal can be described by a formula $K_1 x' \cdot z + k_2 \cdot x'^2$, wherein $k_1$ and $k_2$ are the constants for the two mixing products. Correspondingly, the second mixed signal can be described by a formula $-k_3 x' \cdot z + k_4 x'^2$, wherein $-k_3$ and $k_4$ again are the constants for the mixing products.

The first and second mixed signals represent two parallel branches, corresponding to two opposite phases of the LO signal. The combiner 12 subtracts the second mixed signal from the first mixed signal creating a combined signal. The combined signal is $(k_1+k_3)x' \cdot z + (k_2-k_4) \cdot x'^2$. The latter term of the formula, the square term, is of great importance. If the characteristics $k_2$ and $k_4$ of the two mixing elements are identical, the output of the converter 10 contains only the desired product of the input signals. However, if there is a difference between the characteristics $k_2$ and $k_4$ of the mixing elements MIX1A and MIX1B, a squared term proportional to the difference $k_2-k_4$ is produced in combiner 12 and is included into the combined signal. The degree to which the two branches of a balanced frequency converter must be matched depends on the system to be constructed. For example, to meet the GSM specifications, the mixing elements need to be very closely matched indeed: $k_1/(k_2-k_4) \geq 1000$.

The combiner 12 has an output for providing the combined signal to a post-selection filter 14, which filters out a desired output frequency band.

In FIG. 1 the mixing elements MIX1A and MIX1B have been drawn separately for their better illustration, although typically they are integrated within a single mixing block MIX1.

SUMMARY OF THE INVENTION

According to a first aspect of the invention there is provided a method for converting frequency of an electrical signal, comprising the steps of:

receiving an input signal;

generating a first local signal;

generating a second local signal that is in a different phase than the first local signal;

mixing said input signal with the first local signal to obtain a first product signal;

mixing said input signal with the second local signal to obtain a second product signal; and combining said first and second product signals together, wherein said mixing of said input signal with said first local signal occurs in one time period; and said mixing of said input signal with said second local signal occurs in another time period.

According to a second aspect of the invention there is provided a frequency converter for converting frequency of an electrical signal, comprising:

an input for receiving an input signal;

a first signal source for providing a first local signal;

a second signal source for providing a second local signal that is in a different phase than the first local signal;

a first mixing element for mixing said input signal with the first local signal to obtain a first product signal;

a second mixing element for mixing said input signal with the second local signal to obtain a second product signal; and a combiner for combining said first and second product signals together, wherein said first mixing element is arranged to perform the mixing of said input signal with said first local signal in one time period; and said second mixing element is adapted to perform said mixing of said input signal with said second local signal occurs in another time period.

Preferably, the frequency converter is integrated into a mobile radio device. Such a mobile radio device can avoid at least most of the AM detection.

Preferably, the frequency converter is integrated into a radio network element. Such a radio network element can avoid at least most of the AM detection.

Preferably, the frequency converter is integrated into a radio network. Such a radio network can avoid at least most of the AM detection.

The invention can be used in a number of different implementations comprising mobile telephones and data terminals, radio transceivers of various digital and analogue radio circuits and devices, including radiotelephone terminals and base stations.

BRIEF DESCRIPTION OF THE DRAWINGS

The invention will now be described, by way of example only, with reference to the accompanying drawings, in which.

DETAILED DESCRIPTION

Figure 1:
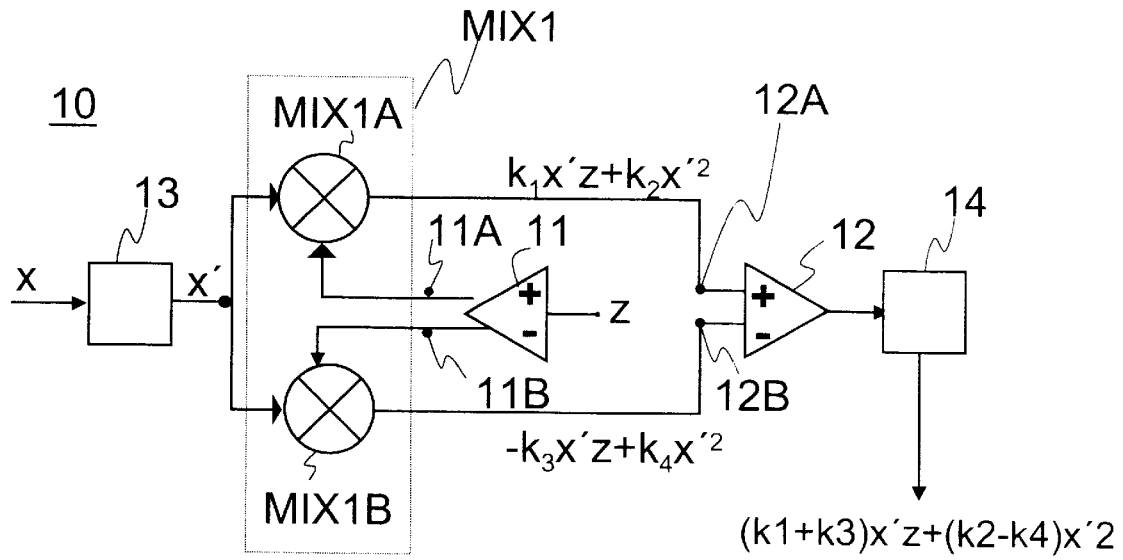
FIG. 1 shows an example of a single balanced frequency converter according to prior art.

FIG. 1 has already been described in the foregoing.

Various embodiments of the invention are next described. These embodiments exemplify down-conversion of radio-frequency input to a base-band. However, the invention is similarly applicable for up-conversion, for example to be used in radio transmitters.

Figure 2:
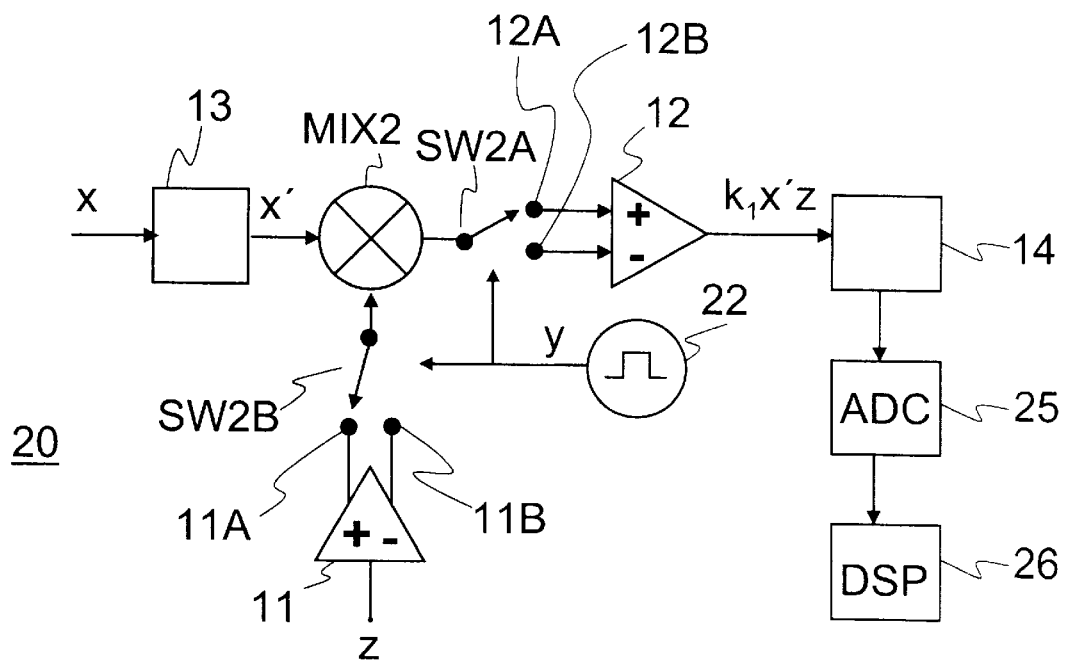
FIG. 2 shows a block diagram of a frequency converter according to a first embodiment of the invention.

FIG. 2 shows a frequency converter 20 according to a first embodiment of the A invention. The converter 20 is used to achieve the same result as prior art converter shown in FIG. 1. However, instead of having two different mixing elements, the converter 20 has a time multiplexed mixing element MIX2, referred to here, for sake of convenience, as a multiplexed mixing element MIX2.

The multiplexed mixing element MIX2 has an input port for a filtered incoming signal x', an input port for a LO signal z and an output for providing a signal mixed with the LO signal. A control signal source 22 provides a control signal y having a frequency $f_y$. The control signal y is used to control a first switch and a second switch, SW2A and SW2B. The switches SW2A and SW2B control, respectively, the phase of the LO signal fed to the multiplexed mixing element MIX2 and the path which is used from the output of the multiplexed mixing element MIX2 to a respective node of the combiner 12.

The second switch SW2B makes a connection between the input port of the multiplexed mixing element MIX2 and alternately either the in-phase LO-signal output 11A or the anti-phase LO-signal output 11B of a phase shifter unit 11. The first switch SW2A makes a connection between the output of the multiplexed mixing element MIX2 and alternately either to the first (in-phase) node 12A or to the second (anti-phase) node 12B of the combiner 12. At a first moment in time, the second switch SW2B couples the in-phase local oscillator output 11A to the LO input port of the multiplexed mixing element MIX2. Simultaneously, the first switch SW2A couples the output of the multiplexed mixing element to the first node 12A of the combiner 12. At a second moment of time, the anti-phase local oscillating signal node 11B is coupled to the LO input port of the multiplexed mixing element MIX2 and the output of the multiplexed mixing element MIX2 is coupled to the second node 12B of the combiner 12. The switching action of the first and second switch SW2A and SW2B is synchronised by the control signal y generated by the pulse generator 22.

Hence, as the control signal y alternates, the multiplexed mixing element MIX2 alternatively mixes the filtered input signal at one moment with an in-phase local oscillating signal and at another moment with an anti-phase local oscillating signal. Each mixing product is provided to a corresponding in-phase node 12A and anti-phase node 12B of the combiner 12. Therefore, half of the time, the frequency converter works in a way, which is equivalent to the upper branch of the frequency converter of FIG. 1. The other half of the time, it works in a way, which is equivalent to the lower branch of the frequency converter of FIG. 1. If the switches SW2B and SW2A are commuted rapidly enough, the mixing product is usable as will be shown later.

The control signal typically triggers the change of the state of the first and second switch by its rising and falling edges. Alternate triggering methods known from prior art are equally applicable.

As the same mixing element MIX2 is used both for the in-phase as well as for the anti-phase part of the signal, imbalances between two different mixing elements will not cause amplitude detection action. Since the control signal y can be arranged to provide equal time-shares for mixing each path of the filtered input signal, the mixing products can be well matched in both mixing paths.

In an alternative modification, the control signal y is not exactly regular, but has some random variation so that the average time-share for mixing each input signal part is still equal.

The combiner 12 receives the two mixed signals one by one. Since the same multiplexed mixing element MIX2 mixes both branches, the branches are perfectly matched with each other and there is no square term $(k2-k4) \cdot x'2$ in the combined signal provided by the combiner 12.

The combined signal is fed to a post-filter 14. This output of the frequency converter 20 can now be digitised by an Analog-to-Digital converter 25 and the digitised signal can be fed to a Digital Signal Processor 26 for further processing. The analog-to-digital converter 25 and the Digital Signal Processor 26 are similar than those that have been commonly used with prior art frequency converters.

In one embodiment of the invention, the frequency converter is used in a mobile phone. In this case the incoming signal comes from an antenna and passes through the pre-selection filter 13 that functions as a band-pass filter. The first switch SW2A generates new frequency components due to switching. Therefore at least three different input frequencies interact in the multiplexed mixing element MIX2.

Figure 3:
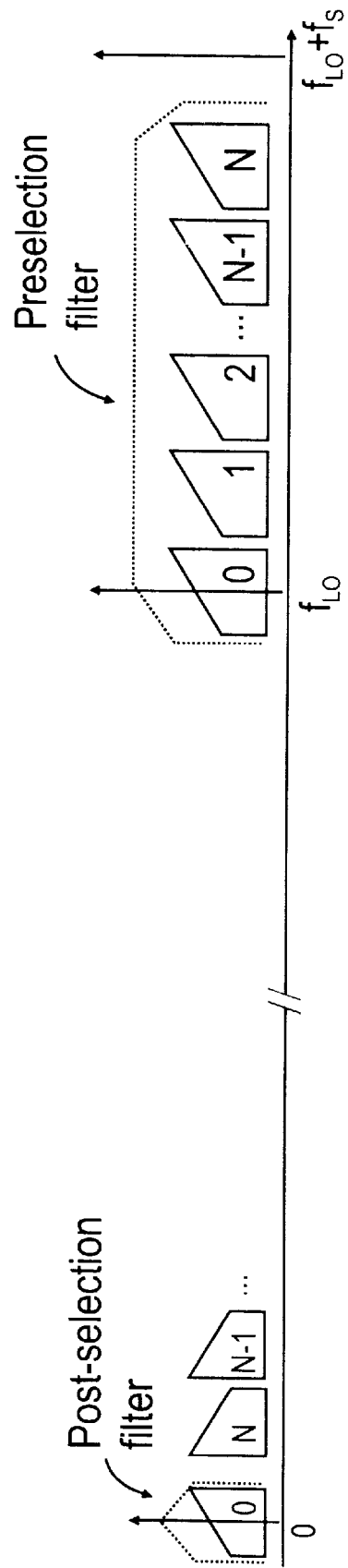
FIG. 3 shows a spectrum depicting the locations of different frequency components in frequency conversion.

FIG. 3 shows a spectrum depicting the locations of the different frequency components during frequency conversion. It illustrates how the frequencies can be chosen in order to produce the desired output signal. For example, if the lowest channel of the Radio Frequency (RF) band is received, LO signal z (having frequency $f_{LO}$) is tuned to a channel 0 frequency which is then mixed down to around zero frequency. The frequency $f_y$ of the control signal y should be chosen so that the frequency $f_{LO}+f_y$ lies outside of the RF band passed by the preselection filter. This band is shown in FIG. 3 as extending from frequency fLO to fLO+fs. Otherwise, the mixing product of a channel N and the control signal y falls inside the band passed by the post-selection filter 14. As this is a potentially harmful noise signal, the control signal y should have a frequency at least as high as the bandwidth of the RF bandwidth of interest, which typically is the bandwidth of the filtered incoming signal x'.

Figure 4:
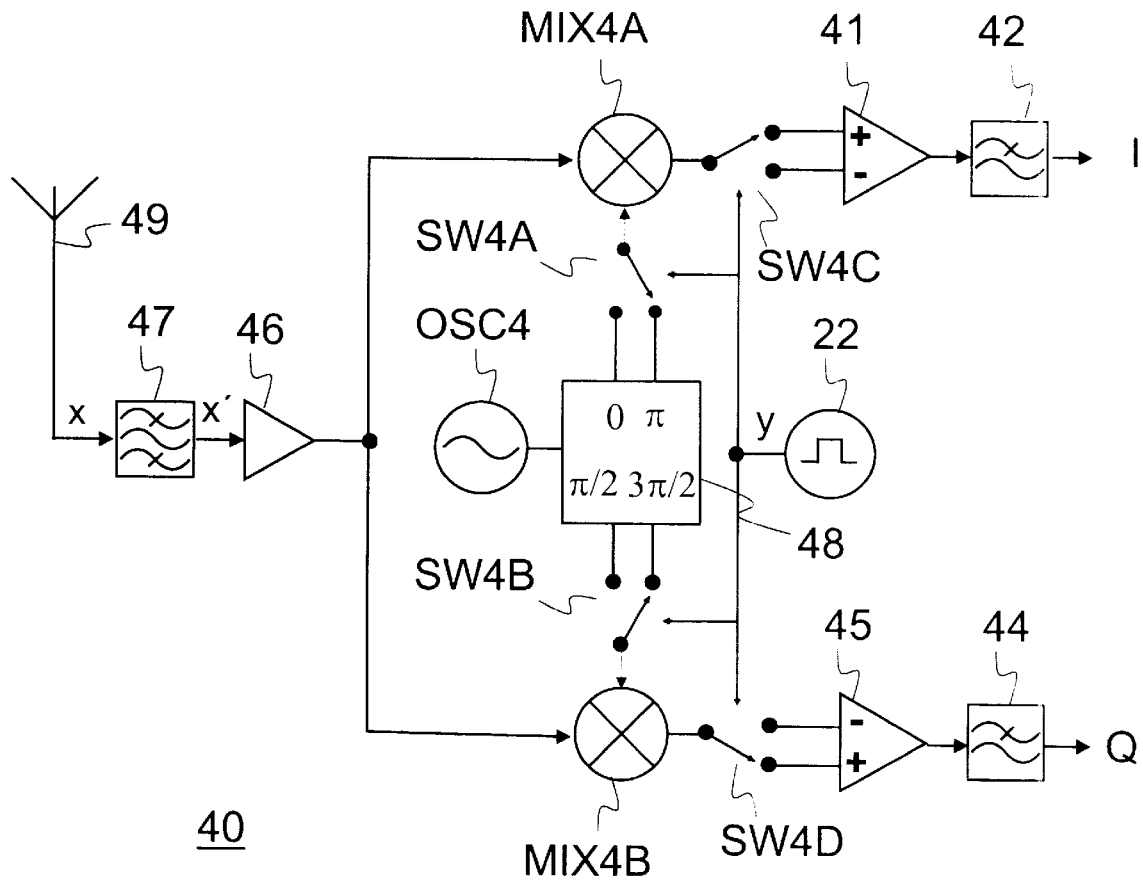
FIG. 4 shows a block diagram of a radio receiver according to a second embodiment of the invention.

FIG. 4 shows a block diagram of a radio receiver 40 for digitally modulated signal according to a second embodiment of the invention. The radio receiver 40 has an antenna 49 for receiving a radio signal x. The radio signal is fed to a pre-filtering block 47, which filters out undesired frequencies leaving a desired filtered signal x'. The filtered signal x' is fed to an amplifier 46 for amplification. The amplified signal is then fed into two parallel main branches, one being an in-phase (I) branch and another being a quadrature (Q) phase branch. Within each main branch, there is connected in series a respective multiplexed mixing element MIX4A, MIX4B, an alternating switch SW4C, SW4D, a combiner 41,45, and a post-selection filter 42,44. The radio receiver 40 additionally has a control signal source 22 for providing a control signal y. The control signal y is provided to the alternating switches SW4C and SW4D for controlling them each alternately to switch the output signal from the respective multiplexed mixing element MIX4A, MIX4B to an in-phase or anti-phase node of the respective combiner 41, 45. The radio receiver 40 additionally has a local oscillator OSC4 for generating an LO signal that is fed to a phase shifter 48. The phase shifter 48 has four outputs, two for each main branch. A first output for the I-branch provides the LO signal without any phase shift, the other output for the I-branch provides the LO signal phase shifted by π. Correspondingly, the two phase shifter outputs for the Q-branch provide the LO signal phase shifted by π/2, and by 3π/2.

The radio receiver 40 has additionally two other alternating switches SW4A and SW4B, also controlled by the control signal y. These switches alternately connect the LO input ports of the multiplexed mixing elements MIX4A and MIX4B to respective two outputs of the phase shifter 48. In FIG. 4, the LO input port of the multiplexed mixer MIX4B is provided alternating with a π/2 or a 3π/2 phase shifted version of the OSC4 local oscillator signal. Likewise, the LO input port of the other multiplexed mixing element MIX4A is provided alternating with un unshifted version or a π phase shifted version of the OSC4 local oscillator signal.

The operation of the radio receiver 40 is next described.

At a first time moment, controlled by the control signal y, the LO input port of the I-branch multiplexed mixing element MIX4A is coupled through the switch SW4A to the LO signal phase shifted by π. The multiplexed mixing element MIX4A mixes the amplified signal with the phase shifted LO signal and generates a first mixed signal. This first mixed signal is fed through the switch SW4C to the in-phase node of the I-branch combiner 41. At the same time moment, the LO input port of the Q-branch multiplexed mixing element MIX4B is coupled through the switch SW4B to the LO signal phase shifted by 3π/2. The multiplexed mixing element MIX4B mixes the amplified signal with the phase shifted LO signal and generates a second mixed signal. This second mixed signal is fed through the switch SW4D to the in-phase node of the Q-branch combiner 45.

At a second time moment, controlled by the control signal y, the LO input port of the I-branch multiplexed mixing element MIX4A is coupled through the switch SW4A to the LO signal phase shifted by 0π. The multiplexed mixing element MIX4A mixes the amplified signal with the LO signal and generates a third mixed signal. This third mixed signal is fed through the switch SW4C to an anti-phase node of the I-branch combiner 41. At the same time moment, the Q-branch multiplexed mixing element MIX4B is coupled through the switch SW4B to the LO signal phase shifted by π/2. The multiplexed mixing element MIX4B mixes the amplified signal with the phase shifted LO signal and generates a fourth mixed signal. This fourth mixed signal is fed through the switch SW4D to the anti-phase node of the Q-branch combiner 45.

The I branch combiner 41 combines the first and the third mixed signals and the Q branch combiner 45 combines the second and the fourth mixed signals.

The outputs of the I- and Q-branch combiners are thereafter fed to respective post-selection filters 42 and 44, which filter out undesired frequencies and leave the desired I- and Q-signals.

After the second time moment, the mixing in the I- and Q-branches is repeated as during the first time moment, although naturally with a different input signal. This cycle repeats continually whilst the radio receiver 40 continues to operate. The switches thus alternate between two states causing the multiplexed mixing elements to alternately mix different phase-shifted LO signals with the amplified input signal in the I- and Q-branches. As a result, each multiplexed mixing element performs in turns the mixing of an in-phase and an anti-phase local oscillator signal with the amplified input signal, and the mixing product is fed to respective in-phase or anti-phase node of the combiner that is in the same branch as the multiplexed mixing element.

Due to the different mixing elements used for the I- and Q-branches, there may exist a mismatch between the I- and Q- branches. Fortunately, this kind of mismatch is less harmful for a direct conversion receiver than the AM detection described in the foregoing. In this embodiment of the invention, the two mixed signals of each mixing element are generated using the same multiplexed mixer and the AM detection action will be greatly reduced.

Figure 5:
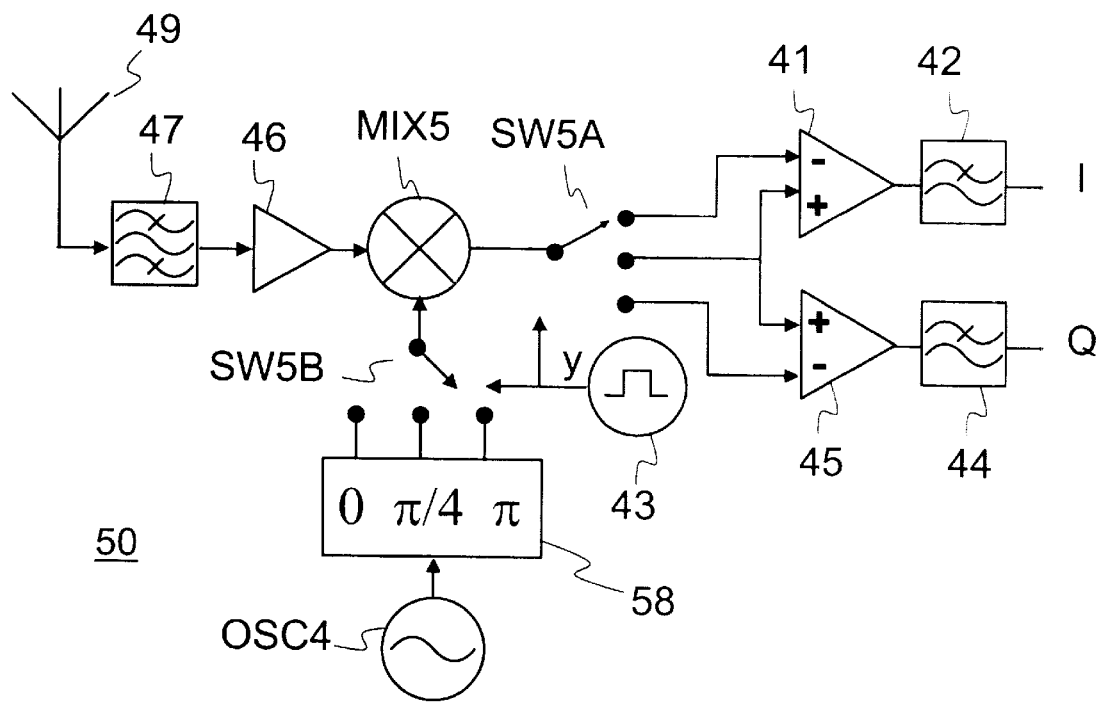
FIG. 5 shows a block diagram of a radio receiver according to a third embodiment of the invention.

FIG. 5 shows a block diagram of a radio receiver 50 according to a third embodiment of the invention. The receiver 50 has, in series, an antenna 49, a pre-selection filter 47 and an amplifier 46. This arrangement is similar to that of FIG. 4. Furthermore, the receiver 50 has, in series, aforementioned blocks, a multiplexed mixing element MIX5, a first switch SW5A and a plurality of branches each having a combiner 41 and 45 in series with a respective post-processing block 42 and 44. In FIG. 5, an upper branch comprising the multiplexed mixing element MIX5, the combiner 41 and the post-processing block 47, is an I-branch and a lower branch comprising the multiplexed mixing element MIX5, the combiner 45 and the post-processing block 44, is a Q-branch. Additionally, the receiver 50 has a local oscillator OSC4 for producing an LO signal coupled to a triple output phase shifter 58 which generates phase shifted copies of the LO signal with phase shifts of 0, $\pi/4$, and $\pi$, each provided by a respective output. The outputs of the phase shifter 58 are coupled, in turn, via a second switch SW5B to the LO port of the multiplexed mixing element MIX5. The output of the multiplexed mixing element MIX5 is at the same time in the same way coupled via a second switch SW5A repeatedly to the anti-phase input ports of the combiners 41, 45 and in between to both of the in-phase input ports of the combiners 41, 45.

The multiplexed mixing element MIX5 receives in turn each of the copies of the phase-shifted LO signal from the three-state phase shifter 58. The combiners receive a first mixed signal and a second mixed signal and a third of the time no mixed signal at all. The first and second switches SW5A and SW5B are controlled by a control signal y that is provided by a control signal source 43.

The first switch SW5A has one input port, for receiving a mixed signal from the multiplexed mixing element MIX5, and three outputs for delivering the mixed signal to appropriate nodes of the combiners 41 and/or 45. A first output of the first switch SW5A is coupled to an anti-phase input port of the I-branch combiner 41. A second output of the first switch SW5A is coupled to an in-phase input port of each of the I-branch and Q-branch combiners 41 and 45. A third output of the first switch SW5A is coupled to an anti-phase input port of the Q-branch combiner 45.

The operation of the radio receiver 50 is next described. At a first time moment, the control signal y causes the first switch SW5A to couple the output of the multiplexed mixing element MIX5 with the anti-phase input port of the I-branch combiner 45. The control signal also causes the second switch SW5B to provide the multiplexed mixing element MIX5A with the 7 shifted copy of the LO signal. The multiplexed mixing element MIX5A mixes the n shifted copy of the LO signal with the amplified signal. The mixed signal is then provided to the anti-phase input port of the combiner 51 of the I-branch.

At a second time moment, the control signal y causes the first switch SW5A to couple the output of the multiplexed mixing element MIX5 with the in-phase input port of both the I-branch combiner 41 and the Q-branch combiner 45. The control signal y also causes the second switch SW5B to provide the multiplexed mixing element MIX5A with the $\pi/4$ shifted copy of the LO signal. The multiplexed mixing element MIX5A mixes the $\pi/4$ shifted copy of the LO signal with the amplified signal. The mixed signal is then provided to the in-phase input port of both the I-branch combiner 41 and the Q-branch combiner 45.

At a third time moment, the control signal y causes the first switch SW5A to couple the output of the multiplexed mixing element MIX5 with the anti-phase input port of the Q-branch combiner 45. The control signal y also causes the second switch SW5B to provide the multiplexed mixing element MIX5A with the un-phase-shifted copy of the LO signal. The multiplexed mixing element MIX5A mixes the un-phase-shifted copy of the LO signal with the amplified signal. The mixed signal is then provided to the anti-phase input port of the combiner 45 of the Q-branch.

After the third time moment, the receiver 50 keeps on repeating the steps taken on the first, second and third time moments.

The control signal generator 43 controls both switch SW5B and switch SW5A to scan the phase shifts in sequential order, either clockwise or counterclockwise to generate the I- and Q-components. The direction of scanning determines which one of the branches will be the I-branch and which branch will be the Q-branch. The switching frequency using three paths is one and half times the switching speed when using two paths. This new frequency conversion arrangement allows construction of a simpler and more accurate baseband part compared to prior art. The benefit of this arrangement compared to the embodiment shown in FIG. 4 is that it is even more compact and it also improves the balance between the I-branch and the Q-branch because only one multiplexed mixing element is used.

If the receiver 50 is used to implement a low-IF receiver, it is advantageous to tune the local oscillator OSC4 for example to a frequency that is between two channels. The spectra of the two channels will then overlap in the baseband.

To suppress an unwanted channel in the baseband, a two branch receiver can be used if a $\pi/4$ phase shift is introduced in the path of one input port of the combiner. Then, the desired baseband signal appears differentially between the branches while the unwanted signal appears as a common mode signal that can easily be suppressed. In a prior art low-IF receivers, the amplitude and phase balance determines the suppression of the unwanted image frequency.

Figure 6:
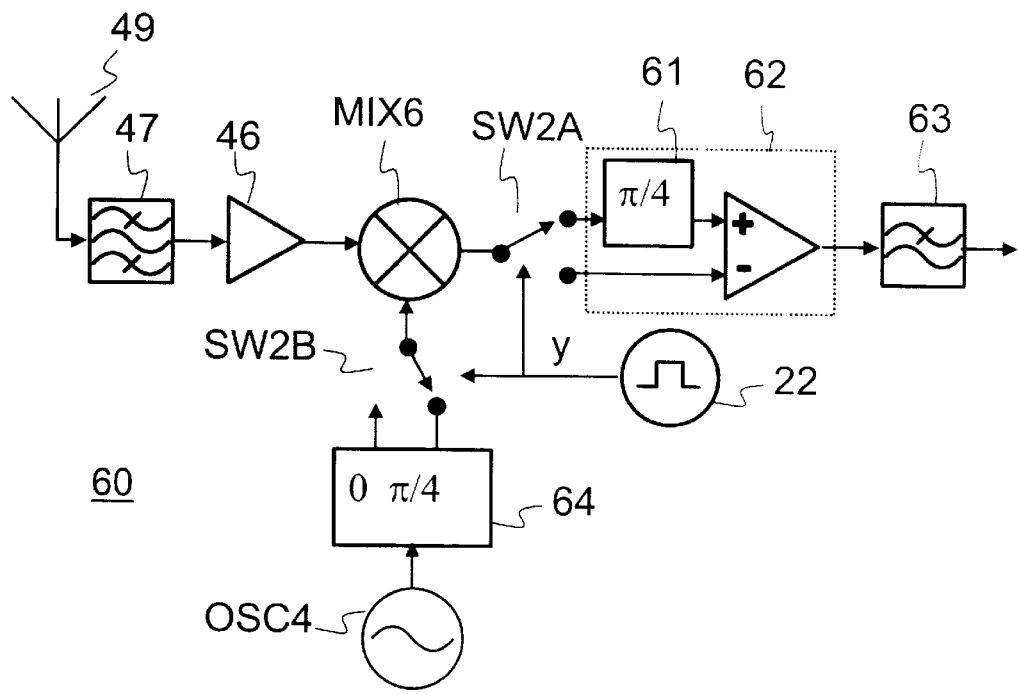
FIG. 6 shows a block diagram of a low-IF radio receiver according to a fourth embodiment of the invention.

FIG. 6 shows a block diagram of a low-IF radio receiver 60 according to a fourth embodiment of the invention. The low-IF receiver 60 has improved image suppression properties. The receiver 60 has, in series, an antenna 49, a pre-selection filter 47 and an amplifier 46. This arrangement is to that of FIG. 4. Furthermore, the radio receiver 60 has, in series, after the aforementioned blocks, a multiplexed mixing element MIX6, a first switch SW2A, a combiner block 62, and a post-processing block 63. The combiner block 62 is different from the previously described combiners in the sense that it also introduces a $\pi/4$ phase shift by a phase shifting element 61 in one of the input ports of the combiner block 62. The first switch SW2A connects the multiplexed mixing element MIX6 to either of the input ports of the combiner block 62. The receiver 60 has further a local oscillator OSC4 coupled to a second phase shifter 64 that is coupled via a second switch SW2B to the LO input port of the multiplexed mixing element MIX6. A control signal source 22 generates a control signal y that synchronizes the operation of the switches SW2B and SW2A.

The operation of the receiver 60 is next described. At a first time moment, the second switch SW2B couples the $\pi/4$ phase shifted LO signal from the second phase shifter 64 to the LO input port of the multiplexed mixing element MIX6. Simultaneously, under control of the control signal y, the first switch SW2A couples the output of the multiplexed mixing element MIX6 to that input port of the comber block 62 that has the phase shifting element 61. The mixing product is further shifted by $\pi/4$ by the first phase shifter 61.

At a second time moment, the second switch SW2B couples the un-phase-shifted LO signal to the LO input port of the multiplexed mixing element MIX6. Simultaneously, under control of the control signal y, the first switch SW2A couples the output of the multiplexed mixing element MIX6 to that input port of the comber block 62 that does not have the phase shifting element 61.

The combiner block 62 has an output that is coupled to a post-selection filter 63 for selecting a desired mixing product. The present invention can be used to eliminate the amplitude imbalance caused by mixing elements of an ordinary mixer arrangement.

Figure 7:
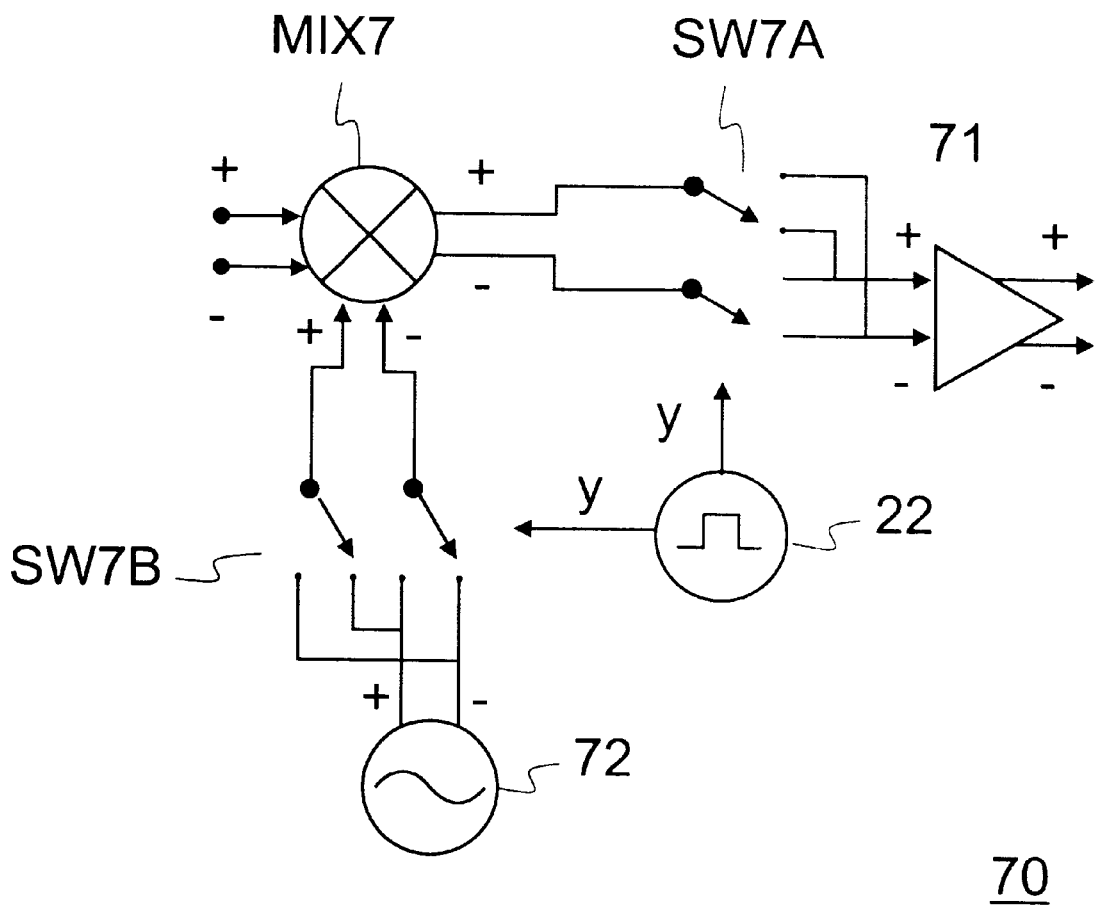
FIG. 7 shows a block diagram of a frequency converter according to a fifth embodiment of the invention.

FIG. 7 shows a block diagram of a double balanced frequency converter according to a fifth embodiment of the invention. This embodiment shows a double balanced frequency converter 70 being implemented using balanced signal circuits and a multiplexed local oscillator. The double balanced frequency converter 70 comprises a differential mixing element MIX7. The differential mixing element MIX7 has a first mixing element output and a second mixing element output. The outputs are coupled to a first differential switch SW7A. The first differential switch SW7A is coupled to a differential combiner 71. The differential combiner 71 has a first combiner input port and a second combiner input port. The combiner 71 has two outputs for providing time multiplexed I- and Q-branch signals. Between the differential mixing element MIX7 and the combiner 71, differential signal paths are used, in which the signals are inverted compared to each other. Such signals can be considered to have a phase difference of π (180 degrees).

The differential mixing element MIX7 has a differential input port, a differential signal input port for inputting a differential signal to be mixed with a differential LO signal, and a differential LO signal input port for receiving a differential LO signal.

A differential LO signal source 72 is coupled through a second differential switch SW7B to the differential LO signal input port of the differential mixing element MIX7.

A control signal source 22 generating the control signal y is coupled both to the first differential switch SW7A and to the second differential switch SW7B in order to synchronise their operation.

The operation of the double balanced frequency converter 70 is next described. The differential LO signal source 72 produces two parallel LO signals, a first LO signal and a second LO signal. The second LO signal is a π/4 shifted copy of the first LO signal. Correspondingly, the differential LO signal input port of the differential mixing element MIX7 has a first LO signal input port and a second LO signal input port.

The double balanced frequency converter 70 alternates between two states. At a first moment of time, it operates in a straight connection mode, in which the differential switches pass through the signals they receive. At a second moment of time, the differential switches twist the signals they pass.

FIG. 7 illustrates the double pole double double throw arrangement of the switches SW7B and SW7A, both operating at the frequency of the control signal y, in order to generate the to the I and Q output signals of the double balanced converter 70.

Figure 8:
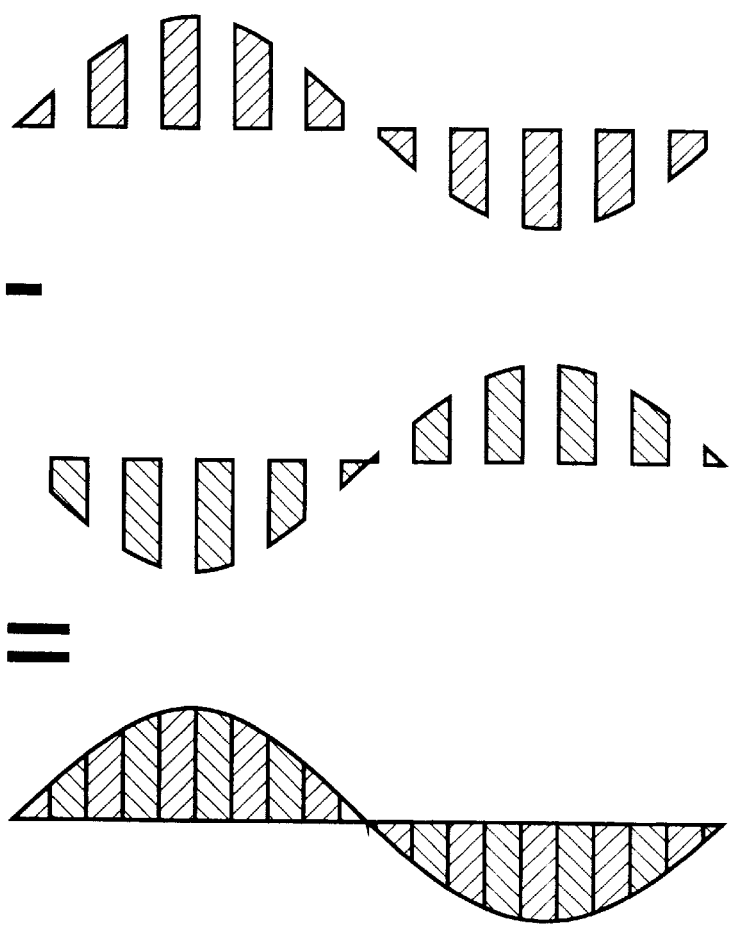
FIG. 8 shows a principal diagram of the waveforms of signals arriving to a combiner and of the output of a combiner according to the first to fifth embodiment of the invention.

FIG. 8 shows a principal diagram of the waveform of signals arriving to a combiner and of the output of a combiner according to the first to fifth embodiments of the invention. On the top of the FIG. 8, a first signal to be combined is shown. On the middle of FIG. 8, a second signal to be combined is shown. On the bottom a combined signal is shown. The first signal to be combined comprises half of a sine wave, chopped into equal length slices separated by blank portions. The second signal to be combined comprises those parts of the sine wave that are removed from the first signal to be combined. Other parts of the second signal to be combined are blank. The first and second signals to be combined correspond to the signals resulting from a time multiplexed mixing process that has been described in the foregoing. The combiner combines the signals to be combined resulting in the combined signal shown on the bottom of FIG. 8. FIG. 8 illustrates that the combiner needs not to receive both signals to be combined simultaneously. At least it does not matter if one of the signals equals to zero half of the time. This will just reduce the signal energy, but amplifying the signal can easily compensate this.

In prior art systems the possibility to amplify the signal is often limited by AM detection that causes a changing DC level, which level when amplified will reduce the dynamic range of a receiver stage.

In FIG. 8, the signals to be combined were assumed ideal and the slices of equal length. It is possible, according to different embodiments of the invention, to vary the length of slices, preferably so that the total energies of each signal to be combined are equal.

Figure 9:
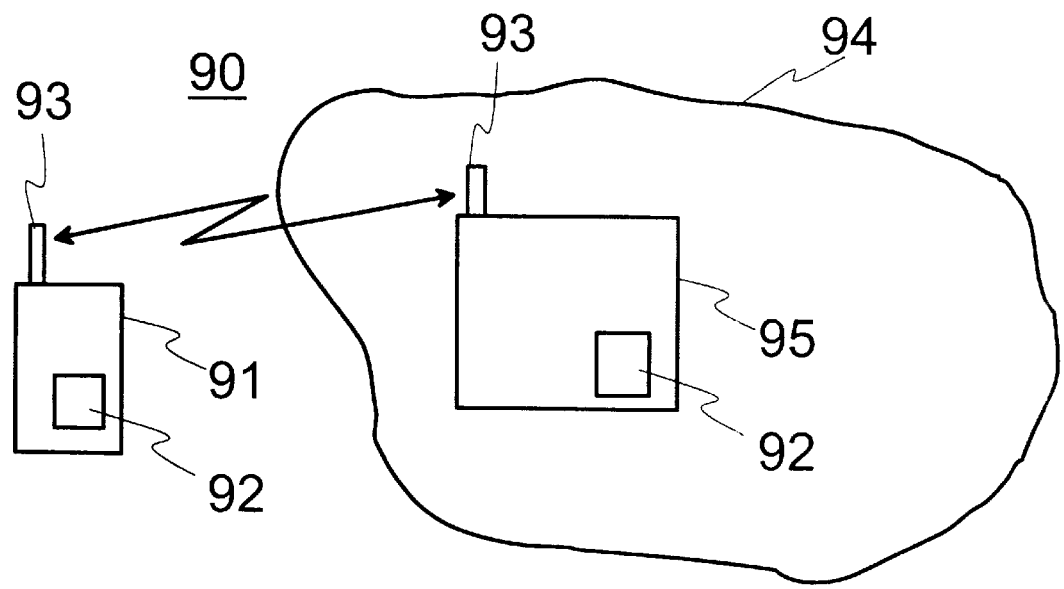
FIG. 9 shows a block diagram of a radio communication system according to an embodiment of the invention.

FIG. 9 shows a block diagram of a radio communication system 90 according to an embodiment of the invention. The system 90 comprises a mobile station 91 and a radio network 94 having a base transceiver station 95. Both the mobile station 91 and the base transceiver station comprise an antenna 93 and a frequency conversion block 92. The frequency conversion block 92 corresponds to frequency conversion blocks according to any embodiment of the invention described before.

When the mobile station transmits, the frequency conversion block 92 up-converts a base band frequency to a radio channel frequency for transmission through the antennas 93 to the frequency conversion block 92 of the transceiver station receiving the broadcast. The frequency conversion block 92 of the transceiver station performs down-conversion from the radio channel frequency to the base band frequency for further processing. Respectively, when the base transceiver station transmits data to the mobile station, the frequency conversion block 92 up-converts a base band frequency to a radio channel frequency for transmission through the antennas 93 to the frequency conversion block 92 of the mobile station receiving the broadcast. The frequency conversion block 92 of the mobile station performs down-conversion from the radio channel frequency to the base band frequency for further processing.

The multiplexed LO phase principle is advantageously used as shown in the first embodiment. That is the simplest case and easiest to implement. This invention can be also used with balanced mixing elements using differential signals.

Although use of balanced mixing elements is not always necessary since the multiplexing takes care of the DC offset, in some situations balanced mixing elements are useful because the circuits before and after the frequency converter have differential interfaces.

FIGS. 2, 4, 5, 6 and 7 show embodiments of converters. It should be noted that the invention is also applicable in transmitters for image rejection.

Particular implementations and embodiments of the invention have been described. It is clear to a person skilled in the art that the invention is not restricted to details of the embodiments presented above, but that it can be implemented in other embodiments using equivalent means without deviating from the characteristics of the invention. The scope of the invention is only restricted by the attached patent claims.

What is claimed is:

1. A method for converting frequency of an electrical signal, comprising the steps of:
   receiving an input signal;
   generating a first local signal;
   generating a second local signal that is in a different phase than the first local signal;
   mixing, in a first mixer at a first point in time, said input signal with the first local signal;
   mixing, in the first mixer at a second point in time, said input signal with the second local signal to obtain a second product signal; and
   combining said first and second product signals together, wherein
   said mixing of said input signal with said first local signal and said mixing of said input signal with said second local signal occur alternatively.

2. A method for phase frequency conversion according to claim 1, wherein said mixing of said input signal with said first local signal and said mixing of said input signal with said second local signal occurs alternately.

3. A method for phase frequency conversion according to claim 1, wherein said combining of said first and second product signals together forms a first combined signal corresponding to a first phase modulated signal.

4. A method for phase frequency conversion according to claim 3, wherein said method further comprises the steps of:
   generating a third local signal;
   generating a fourth local signal that is in a different phase than the third local signal;
   mixing said input signal with the third local signal to obtain a third product signal;,
   mixing said input signal with the fourth local signal to obtain a fourth product signal; and
   combining said third and fourth product signals together into a second combined signal corresponding to a second phase modulated signal, the second combined signal being different than the first combined signal.

5. The method of claim 1 wherein the mixer has a single output node and the first product signal and the second product signal are alternately output from the mixer separated from each other by time.

6. The method of claim 1 wherein the mixer alternatingly outputs the first product signal and the second product signal from a single output node of the mixer.

7. A frequency converter for converting frequency of an electrical signal, comprising:
   an input for receiving an input signal;
   a first signal source for providing a first local signal;
   a second signal source for providing a second local signal that is in a different phase than the first local signal;
   a first mixing element for mixing said input signal with the first local signal to obtain a first product signal;
   a second mixing element for mixing said input signal with the second local signal to obtain a second product signal; and
   a combiner for combining said first and second product signals together, wherein
   said first mixing element is arranged to perform the mixing of said input signal with said first local signal in one time period;
   said second mixing element is adapted to perform said mixing of said input signal with said second local signal in another time period; and
   said mixing of said input signal with said first local signal and said mixing of said input signal with said second local signal occur alternatively.

8. A frequency converter for phase frequency conversion according to claim 7, wherein said first mixing elements and second mixing element comprise a common mixing element.

9. A frequency converter for phase frequency conversion according to claim 7, wherein said first mixing element and second mixing element are arranged to perform alternately said mixing of said input signal with said first local signal and said mixing of said input signal with said second local signal.

10. A frequency converter for phase frequency conversion according to claim 7, wherein said first mixing element and second mixing element are arranged to perform repeatedly said mixing of said input signal with said first local signal and said mixing of said input signal with said second local signal.

11. A frequency converter for phase frequency conversion according to claim 7, wherein said combining of said first and second product signals together forms a first combined signal corresponding to a first phase modulated signal.

12. A frequency converter for phase frequency conversion according to claim 11, wherein said converter further comprises:
    means for generating a third local signal;
    means for generating a fourth local signal that is in a different phase than the third local signal;
    means for mixing said input signal with the third local signal to obtain a third product signal;
    means for mixing said input signal with the fourth local signal to obtain a fourth product signal; and
    means for combining said third and fourth product signals together into a first combined signal corresponding to a second phase modulated signal, the second combined signal being different than the first combined signal.

13. A frequency converter-system comprising:
    an input port adapted to receive an input signal;
    a multiplexed mixing element adapted to receive the input signal and output a first signal and a second signal, alternately, from a common output, the first and second signal separated in time, wherein the first signal comprises the input signal mixed with an in-phase local oscillator signal and the second signal comprises the input signal mixed with an out-of-phase local oscillator signal; and
    a combiner adapted to receive the first signal from the mixing element on a first input and the second signal from the mixing element on a second input and output a combined signal.

14. The system of claim 13 wherein a first switch is used to couple either an in-phase local oscillator output signal or an out-of-phase local oscillator output signal to a local oscillator input port of the mixing element.

15. The system of claim 14 wherein a second switch is used to couple an output of the mixing element between the first input and the second input of the combiner in an alternating manner.

16. The system of claim 13 further comprising a control signal source adapted to produce a control signal having a first state adapted to control a transmission of the in-phase local oscillator signal input to the multiplexed mixing element and output the in-phase mixed signal to a first input of the combiner, and a second state adapted to control a transmission of the out-of-phase local oscillator signal input to the mixer and output an out-of-phase mixed signal to the combiner.

17. The system of claim 13 further comprising a control signal source adapted to control a state of a first switch and a second switch, wherein the first switch is adapted to switch between an in-phase and an out-of-phase local oscillator signal inputted to the multiplexed mixing element and the second switch is adapted alternately switch an output of the mixing element between respective input nodes of the combiner depending upon the state of the first switch.

* * * * *